(12) United States Patent
Narayan et al.

(10) Patent No.: US 6,423,983 B1
(45) Date of Patent: Jul. 23, 2002

(54) OPTOELECTRONIC AND MICROELECTRONIC DEVICES INCLUDING CUBIC ZNMGO AND/OR CDMGO ALLOYS

(75) Inventors: Jagdish Narayan, Raleigh, NC (US); Ajay Kumar Sharma, Hillsboro, OR (US); John F. Muth, Cary, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/687,519

(22) Filed: Oct. 13, 2000

(51) Int. Cl.⁷ .................................................. H01L 33/00

(52) U.S. Cl. ....................................... 257/96; 257/103

(58) Field of Search ............................. 257/96, 97, 98, 257/99, 100, 101, 102, 103, 431, 436

(56) References Cited

U.S. PATENT DOCUMENTS

| | | | |
|---|---|---|---|
| 5,166,257 A | 11/1992 | Boswell et al. | 524/576 |
| 5,406,123 A | 4/1995 | Narayan | 257/767 |
| 5,679,965 A | * 10/1997 | Schetzina | 257/103 |
| 5,851,905 A | 12/1998 | McIntosh et al. | 438/492 |
| 5,955,178 A | 9/1999 | Orita et al. | 428/210 |
| 6,046,464 A | 4/2000 | Schetzina | 257/96 |

OTHER PUBLICATIONS

E.R. Segnit and A.E. Holland, "the system MgO–ZnO–SiO2", Journal of the American Ceramic Society, 48(8): 409–413 (Aug. 1965).*
E.R. Segnit and A.E. Holland, "The System MgO–ZnO–SiO$_2$," Journal of the American Ceramic Society, 48(8): 409–413 (Aug. 1965).
S. Strite and H. Morkoç, "GaN, AlN, and InN: A review," J. Vac. Sci. Technol B, 10(4): 1237–1266 (Jul./Aug. 1992).
Narayan et al., "Epitaxial Growth of TiN Films on (100) Silicon Substrates by Laser Physical Vapor Deposition," Appl. Phys. Lett., 61(11): 1290–1292 (Sep. 14, 1992).
Vispute et al., "Pulsed Laser Deposition and Characterization of Epitaxial Cu/TiN/Si(100) Heterostructures," Appl. Phys. Lett., 65(20): 2565–2567 (Nov. 14, 1994).
Vispute et al., "Epitaxial Growth of AlN Thin Films on Silicon (111) Substrates by Pulsed Laser Deposition," J. Appl. Phys., 77(9): 4724–4728 (May 1, 1995).
Dovidenko et al., "Aluminum Nitride Films on Different Orientations of Sapphire and Silicon," J. Appl. Phys., 79(5): 2439–2445 (Mar. 1, 1996).
Vispute et al., "Heteroepitaxial Structures of SrTiO$_3$/TiN on Si(100) by in situ Pulsed Laser Deposition," J. Appl. Phys., 80(12): 6720–6724 (Dec. 15, 1996).
Bagnall et al., "Optically Pumped Lasing of ZnO at Room Temperature," Appl. Phys. Lett., 70(17): 2230–2232 (Apr. 28, 1997).
Ohtomo et al., "Mg$_x$Zn$_{1-x}$O as a II–VI Widegap Semiconductor Alloy," Appl. Phys. Lett., 72(19): 2466–2468 (May 11, 1998).

(List continued on next page.)

Primary Examiner—David Nelms
Assistant Examiner—Thao P Le
(74) Attorney, Agent, or Firm—Myers Bigel Sibley & Sajovec, P.A.

(57) ABSTRACT

An electronic device has an alloy layer containing magnesium oxide and at least one of zinc oxide and cadmium oxide and having a cubic structure on a substrate. The alloy layer may be directly on the substrate or, alternatively, one or more buffer layers may be between the alloy layer and the substrate. The alloy layer may be domain-matched epitaxially grown directly on the substrate, or may be lattice-matched epitaxially grown directly on the buffer layer. The cubic layer may also be used to form single and multiple quantum wells. Accordingly, electronic devices having wider bandgap, increased binding energy of excitons, and/or reduced density of growth and/or misfit dislocations in the active layers as compared with conventional III-nitride electronic devices may be provided.

42 Claims, 8 Drawing Sheets

OTHER PUBLICATIONS

Tang et al., "Room–Temperature Ultraviolet Laser Emission from Self–Assembled ZnO Microcrystallite Thin Films," *Appl. Phys. Lett.,* 72(25): 3270–3272 (Jun. 22, 1998).

Shuji Nakamura, "The Roles of Structural Imperfections in InGaN–Based Blue Light–Emitting Diodes and Laser-Diodes," *Science,* 281(5379): 956–961 (Aug. 14, 1998).

Narayan et al., "Defects and Interfaces in Epitaxial ZnO/ α–$Al_2O_3$ and AlN/ZnO/ α–$Al_2O_3$ Heterostructures," *J. Appl. Phys.,* 84(5):2597–2601 (Sep. 1, 1998).

Muth et al., "Excitonic Structure and Absorption Coefficient Measurements of ZnO Single Crystal Epitaxial Films Deposited by Pulsed Laser Deposition," *J. Appl. Phys.,* 85(11): 7884–7887 (Jun. 1, 1999).

Pearton et al., "GaN: Processing, Defects, and Devices," *J. Appl. Phys.,* 86(1): 3327–3329 (Jul. 1, 1999).

Sharma et al., "Optical and Structural Properties of Epitaxial $Mg_xZn_{1-x}O$ Alloys," *Appl. Phys. Lett.,* 75(21): 3327–3329 (Nov. 22, 1999).

Jain et al., "III–Nitrides: Growth, Characterization, and Properties," *J. Appl. Phys.,* 87(3): 965–1006 (Feb. 1, 2000).

Teng et al., "Refractive Indices and Absorption Coefficients of $Mg_xZn_{1-x}O$ Alloys," *Appl. Phys. Lett.* 76(8): 979–981 (Feb. 21, 2000).

* cited by examiner

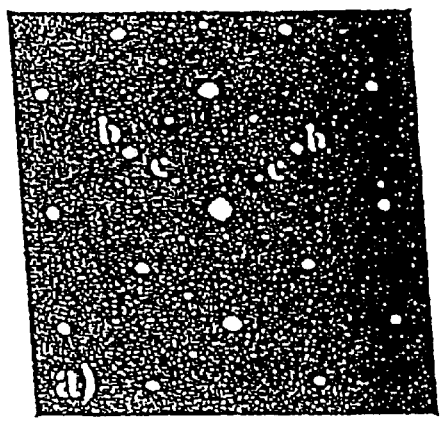
ZnMgO/Spinel    FIG. 10A
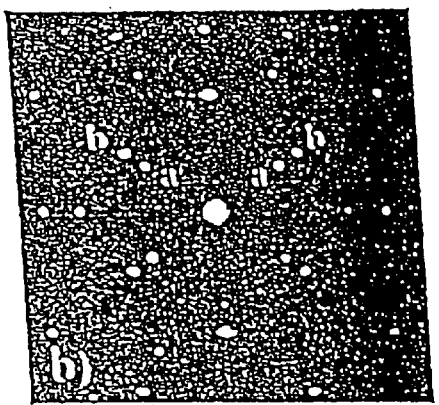
TiN/Si(100)    FIG. 10B
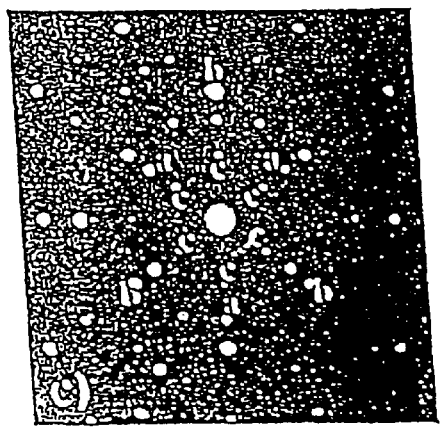
ZnMgO/Spinel/
TiN/Si(100)    FIG. 10C

US 6,423,983 B1

OPTOELECTRONIC AND MICROELECTRONIC DEVICES INCLUDING CUBIC ZNMGO AND/OR CDMGO ALLOYS

STATEMENT OF FEDERAL SUPPORT

The present invention was supported by the National Science Foundation Center for Advanced Materials and Smart Structures at North Carolina State University. The United States government may have certain rights to this invention.

FIELD OF THE INVENTION

This invention relates to optoelectronic and microelectronic devices and fabrication methods therefor, and more particularly to semiconductor devices having semiconducting oxide layers, and fabrication methods therefor.

BACKGROUND OF THE INVENTION

Optoelectronic and microelectronic devices are widely used in consumer and commercial applications. Optoelectronic devices include, but are not limited to, light-emitting diodes, laser diodes, photodetectors, optical modulators and/or broad band light sources. Microelectronic devices include, but are not limited to, transistors such as CMOS transistors, field effect transistors, and/or bipolar transistors, field emitters, high-power devices, and/or other integrated circuits. Optoelectronic devices and microelectronic devices will be referred to herein generically as "electronic devices."

Many microelectronic devices are silicon-based. However, for high-temperature and high-power applications, other materials are being investigated and used for microelectronic devices. Similarly, other materials are being investigated for optoelectronic devices having a wider bandgap that can cover a wider range of the optical spectrum. For example, III-nitrides and their alloys having hexagonal structure are being widely investigated for microelectronic devices as well as optoelectronic devices. Mechanical, optical and electrical properties of III-nitrides are described, for example, in the publication entitled *III-Nitrides: Growth, Characterization, and Properties* to Jain et al., J. Appl. Phys., Vol. 87, No. 3, Feb. 1, 2000, pp. 965–1006. Hexagonal wurtzite polytypes of III-nitrides (InN, GaN, and AlN) can form continuous solid solutions with direct bandgaps ranging from 1.9 eV (InN) to 3.4 eV (GaN) to 6.2 eV (AlN). Thus, the emission wavelength can be tuned from about 653 nm (red) to about 200 nm (deep ultraviolet). The binding energy of excitons in the nitride system is about 20 meV for gallium nitride. Because the stable phase of III-nitrides and their alloys is hexagonal wurtzite, these materials only may be grown via lattice-matching epitaxy on hexagonal substrates such as 6H-silicon carbide (0001) and zinc oxide (0001).

On more practical substrates, such as hexagonal (0001) sapphire ($\alpha$-$Al_2O_3$), epitaxial growth only may occur via domain-matching epitaxy, where integral multiples of lattice constants on major planes of the film and substrate match across the interface, as described, for example, in U.S. Pat. No. 5,406,123 to Narayan, which discusses the epitaxial growth of titanium nitride films on silicon or gallium arsenide substrates. For example, the domain matching epitaxy on the basal plane after 30° or 90° rotation $[1210]_{nitride}\|[0110]_{sap}$ involves the matching of 7 planes of the III-nitride films with 6 planes of sapphire. The epitaxial films of III-nitrides and their alloys on sapphire contain a high density of growth and misfit related dislocations which may adversely affect the lifetimes of optical devices, particularly lasers, as described in the publication entitled *The Roles of structural Imperfections in InGaN-Based Blue Light-Emitting Diodes and Laser Diodes* to Nakamura, Science, Vol. 281, No. 5379, Aug. 14, 1998, pp. 956–961. Epitaxial growth of hexagonal nitrides may be possible on (111) planes of cubic silicon, as described, for example, in he publication entitled *Epitaxial Growth of AlN Thin Films on Silicon (111) Substrates by Pulsed Laser Deposition* to Vispute, J. Appl. Phys., Vol. 77, No. 9, May 1, 1995, pp. 4724–4728. However, this may not be a practical plane as most silicon microelectronic devices are fabricated on (100) silicon.

As an alternative to III-nitrides, zinc oxide having an hexagonal wurtzite structure and its alloys with magnesium oxide (ZnMgO having a wurtzite structure) are being investigated. It is known to alloy zinc oxide with magnesium oxide to form high quality single crystal films having magnesium content between zero and 34 at. % while retaining the hexagonal zinc oxide lattice structure, as described, for example, in the publications entitled $Mg_xZn_{1-x}O$ as a II-VI Wide Gap Semiconductor Alloy to Ohtomo et al., Appl. Phys. Lett., Vol. 72, No. 19, May 11, 1998, pp. 2466–2468; Optical and Structural Properties of Epitaxial $Mg_xZn_{1-x}O$ Alloys to Sharma et al., Appl. Phys. Lett., Vol. 75, No. 21, Nov. 22, 1999, pp. 3327–3329; Refractive Indices and Absorption Coefficients of $Mg_xZn_{1-x}O$ Alloys to Teng et al., Appl. Phys. Lett., Vol. 76, No. 8, Feb. 21, 2000, pp. 979–981. The bandgap of this alloy was found to be variable with magnesium content with an upper limit around 4.19 eV. This alloy may produce a bright ultraviolet (UV) luminescence at room temperature that is excitonic in nature. Since the exciton binding energy in the ZnO system is higher (approximately 60 meV) than that in the III-nitride system (approximately 20 meV for GaN), tightly bound excitons may be responsible for higher brightness or luminescence efficiency. As with the III-nitrides and their alloys, ZnMgO alloys having an hexagonal wurtzite structure may only be grown via lattice-matching epitaxy on hexagonal substrates, such as 6 H-silicon carbide (0001) and zinc oxide (0001), and may only be grown via domain-matching epitaxy on more practical hexagonal substrates such as hexagonal (0001) sapphire ($\alpha$-$Al_2O_3$). Epitaxial growth of ZnMgO alloys having an hexagonal wurtzite structure may be possible on (111) planes of cubic silicon. However, as noted above, this may not be a practical plane of cubic silicon. Thus, these hexagonal zinc oxide systems as well as III-nitrides may not be epitaxially integrated with silicon (100) of cubic symmetry. This may be an important consideration as microelectronic devices and integrated circuits are fabricated almost exclusively on silicon (100) substrates.

Zinc oxide layers having hexagonal structures are described, for example, in *Optically Pumped Lasing of ZnO at Room Temperature* to Bagnall et al., Appl. Phys. Lett., Vol. 70, No. 17, Apr. 28, 1997, pp. 2230–2232; *Defects and interfaces in Epitaxial ZnO/$\alpha$-$Al_2O_3$ and AlN/ZnO/$\alpha$-$Al_2O_3$ Heterostructures* to Narayan et al., J. Appl. Phys., Vol. 84, No. 5, Sep. 1, 1998, pp. 2597–2601; *Room-Temperature Ultraviolet Laser Emission from Self-Assembled ZnO Microcrystallite Thin Films*, Appl. Phys. Lett., Vol. 72, No. 25, Jun. 22, 1998, pp. 3270–3272; *Excitonic Structure and Absorption Coefficient Measurements of ZnO Single Crystal Epitaxial Films Deposited By Pulsed Laser Deposition*, J. Appl. Phys., Vol. 85, No. 11, Jun. 1, 1999, pp. 7884–7887; and U.S. Pat. No. 6,046,464 to Schetzina. Epitaxial and polycrystalline zinc oxide films may provide lasing action. Zinc oxide films may also 10 luminesce very brightly in UV and grow 2-D on c-plane sapphire with a low density of extended defects. Zinc oxide alloys having hexagonal wurtzite structure are described, for example, in U.S. Pat. No. 5,955,178 to Orita et al.

SUMMARY OF THE INVENTION

Embodiments of the present invention provide electronic devices having a cubic alloy layer comprising magnesium oxide and at least one of zinc oxide and cadmium oxide. These cubic alloy layers can be integrated with cubic (100) silicon substrates via domain-matching epitaxy where four lattice constants of the cubic alloy can match with three lattice constants of the silicon substrate. Since the critical thickness (i.e., the minimum thickness to eliminate occurrence of misfit dislocations caused by the lattice mismatch) under this domain matching epitaxy may be less than one monolayer, many if not all of the misfit dislocations may be introduced at the beginning of the formation of the film, which may result in a film that is relaxed with many if not all of the dislocations confined to the interface. Cubic alloys according to embodiments of the present invention also may provide a cubic system having a broader bandgap than the conventional hexagonal wurtzite III-nitride system InN-GaN-AlN. Moreover, the excitons in zinc oxide may be more tightly bound than the excitons of the III-nitride system. As a result, optoelectronic devices having cubic zinc oxide alloy layers according to embodiments of the present invention may provide improved optoelectronic properties such as luminescence efficiency over conventional III-nitride systems. For example, cubic zinc oxide alloy layers of embodiments of the present invention may provide more efficient light emission for optoelectronic devices such as LEDs and lasers, as well as brighter excitonic light emission at room temperature.

More specifically, electronic devices according to embodiments of the present invention include a substrate and an alloy layer comprising magnesium oxide and at least one of zinc oxide and cadmium oxide on the substrate. The alloy layer has a cubic structure. In some embodiments, the alloy layer preferably consists essentially of between about 0.1 and 40 at. % zinc and between about 60 an 99.9 at. % magnesium. Alternatively, in other embodiments, the alloy layer preferably consists essentially of between about 0.1 and 15 at. % cadmium and between about 85 and 99.9 at. % zinc. The alloy layer may be a monocrystalline alloy layer. The substrate may consist of material having a cubic structure and may contain, for example, magnesium oxide, silicon, and/or gallium arsenide. The substrate may also consist of material having a hexagonal structure and may contain, for example, $\alpha$-$Al_2O_3$ sapphire and/or 6H-silicon carbide.

In some embodiments, the alloy layer may be a domain-matched epitaxial layer that is directly on the substrate. Alternatively, in other embodiments, the microelectronic device may include a buffer layer between the substrate and the alloy layer. The buffer layer may be a domain-matched epitaxial layer directly on the substrate, and the alloy layer may be a lattice-matched epitaxial layer directly on the buffer layer. In other embodiments, the electronic device may include a titanium nitride layer between the substrate and the alloy layer. The substrate may be silicon, and the titanium layer and the silicon substrate may form a titanium nitride-silicon epilayer hetereostructure. In other embodiments, the electronic device may include a magnesium oxide layer between the titanium nitride layer and the alloy layer. The magnesium oxide layer, the titanium nitride layer, and the silicon substrate may form a magnesium oxide-titanium nitride-silicon epilayer heterostructure.

In other embodiments, the alloy layer is a first alloy layer having a first bandgap preferably with electron doping. The electronic device includes a second alloy layer with a second bandgap narrower than the first bandgap on the first alloy layer and a third alloy layer having a third bandgap preferably with hole doping wider than the second bandgap on the second alloy layer to thereby provide a quantum well. The third alloy layer may comprise magnesium oxide and at least one of zinc oxide and cadmium oxide and have a cubic structure. In still other embodiments, the electronic device has a plurality of alternating layers of the first alloy and the second alloy on the substrate to provide a multiple quantum well.

Electronic devices, according to embodiments of the present invention, are fabricated by forming an alloy layer comprising magnesium oxide and at least one of zinc oxide and cadmium oxide and having a cubic structure on a substrate. In some embodiments, the forming step may include domain-matching epitaxially growing the alloy layer on the substrate. The forming step is preferably performed by pulsed laser depositing the alloy layer on the substrate. In other embodiments, a buffer layer may be formed on the substrate prior to the forming of the alloy layer, and the step of forming the alloy layer on the substrate may include forming an alloy layer comprising magnesium oxide and at least one of zinc oxide and cadmium oxide and having a cubic structure on the buffer layer on the substrate. In other embodiments, forming the buffer layer on the substrate may include the step of domain-matching epitaxially growing the buffer layer on the substrate, and forming the alloy layer on the buffer layer on the substrate may include the operation of lattice-matching epitaxially growing the alloy layer on the buffer layer. The substrate may be silicon, and the buffer layer may be titanium nitride. Accordingly, electronic devices having improved bandgap, increased binding energy of excitons, and/or reduced density of growth and/or misfit dislocations compared with conventional III-nitride electronic devices may be provided.

BRIEF DESCRIPTION OF THE DRAWINGS

FIG. 10A shows the [011] zone axis selected area diffraction pattern from the cubic ZnMgO/spinel interface of the embodiments illustrated in FIG. 7 according to embodiments of the present invention.

FIG. 10B shows the [011] zone axis selected area diffraction pattern from the TiN/Si interface of the embodiments of FIG. 7 according to embodiments of the present invention.

FIG. 10C shows the (011) zone axis selected area diffraction pattern from all the layers in the heterostructure of the embodiments illustrated in FIG. 7 according to embodiments of the present invention.

DETAILED DESCRIPTION OF PREFERRED EMBODIMENTS

Figure 1:
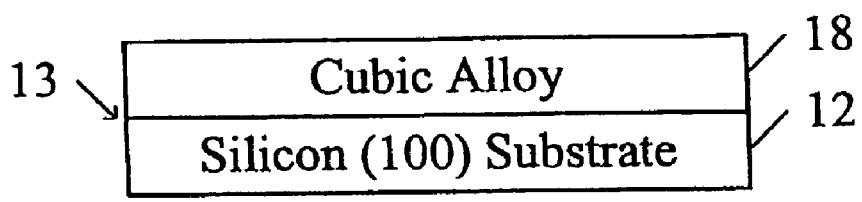
FIG. 1 is a cross-sectional view of embodiments of electronic devices according to the present invention having a cubic alloy layer on a silicon substrate.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may be present. In contrast, when an element is referred to as being "directly on" another element, there are no intervening elements present. Moreover, each embodiment described and illustrated herein includes its complementary conductivity type embodiment as well.

Referring now to FIG. 1, embodiments of electronic devices according to the present invention will now be described. A cubic alloy layer 18 is directly on a silicon (100) substrate 12. Although the embodiments illustrated in FIG. 1 show a silicon (100) substrate, it is to be understood that substrates according to the present invention may be various materials that have a cubic structure including, but not limited to, silicon having a different orientation (such as (111)), magnesium oxide and/or gallium arsenide. Moreover, the substrates according to the present invention may be various materials that have a hexagonal structure including, but not limited to, sapphire ($\alpha$-$Al_2O_3$) and/or 6H-silicon carbide. Substrates according to the present invention may also be a semiconductor (such as silicon) on insulator structure, as will be understood by those skilled in the art, where the semiconductor layer has a cubic or hexagonal structure.

Still referring to FIG. 1, the cubic alloy layer 18 includes magnesium oxide and at least one or zinc oxide and cadmium oxide. In some embodiments, the cubic alloy layer 18 consists essentially of between about 0.1 and 40 at. % zinc and between about 60 and 99.9 at. % magnesium. In other embodiments, the cubic alloy layer 18 consists essentially of between about 0.1 and 18 at. % zinc and between about 82 and 99.9 at. % magnesium oxide. In still other embodiments, the cubic alloy layer consists essentially of between about 0.1 and 15 at. % cadmium and between about 85 and 99.9 at. % magnesium. The cubic alloy layer 18 is preferably a monocrystalline alloy layer.

Beyond the maximum magnesium content of 34 at. % in the zinc oxide lattice, a phase separation into magnesium and zinc oxide may occur. On the other side of the composition range, the zinc oxide-magnesium oxide phase diagram may predict a solid solution of zinc oxide in cubic magnesium oxide lattice having a concentration of up to 40 at. % zinc oxide or zincite. Zinc oxide is hexagonal, whereas magnesium oxide is cubic with sodium chloride structure ($\alpha$=4.213 Å). The similarity in ionic radii between $Mg^{++}$ (1.36 Å) and $Zn^{++}$ (1.25 Å) may allow significant replacement in either structure. The phase diagram may predict that magnesium allows a maximum of 56 wt. % zinc oxide (40 at. %) at 1600° C. and maintains its NaCl structure with the lattice constant increasing only slightly less than 1% with zinc oxide. While the phase diagram may predict such magnesium oxide-zinc oxide alloys, such alloys have heretofore not been synthesized.

Cubic alloy layers according to embodiments of the present invention may provide electronic devices, such as optoelectronic and microelectronic devices, having improved characteristics over conventional III-nitride systems. For example, a cubic cadmium oxide/zinc oxide/magnesium oxide alloy layer according to embodiments of the present invention preferably has a bandgap that can be tuned from about 2.0 eV to 8.0 eV (2.0 eV for cadmium oxide to 3.4 eV for zinc oxide to 8.0 eV for magnesium oxide), which is wider than the bandgap provided by conventional III-nitride systems. The cubic cadmium oxide/zinc oxide/magnesium oxide alloy layer preferably comprises about ⅓ by weight cadmium oxide, about ⅓ by weight zinc oxide, and about ⅓ by weight magnesium oxide. A wider bandgap may allow for optoelectronic devices such as light-emitting diodes, laser diodes, and UV detectors including solar blind detectors and windows that are transparent to ultraviolet radiation. The excitons in the cubic zinc oxide alloy layer may be more tightly bound that those in the III-nitride systems and, thus, may be confined locally to provide more efficient light emission for microelectronic devices such as light emitting diodes and lasers. The binding energy of excitons in the cubic zinc oxide alloy layer (binding energy of excitons in zinc oxide is about 60 meV) may be higher than that in the nitride system (binding energy of excitons in gallium nitride is about 20 meV). The higher binding energy in the cubic zinc oxide alloy layer may permit brighter excitonic light emission at room temperature in the zinc oxide system than can be obtained with the III-nitride system.

Still referring to FIG. 1, the cubic alloy layer 18 maybe formed on the silicon (100) substrate 12 by various processes. For example, a cubic zinc oxide-magnesium oxide layer 18 may be domain-matching epitaxially grown on the silicon (100) substrate 12 resulting in an alloy-substrate interface 13 where four lattice constants of the cubic zinc oxide-magnesium oxide alloy domain-match with three lattice constants of the silicon substrate. As will be understood by those skilled in the art, domain-matching epitaxy may be performed, for example, as described in U.S. Pat. No. 5,406,123 to Narayan, the disclosure of which is incorporated herein in its entirety and will not be further described. By providing cubic alloy layers having a lattice mismatch with silicon that is lower than that of conventional III-nitride systems, a lower density of growth and misfit related dislocations may be obtained by alloy layers of the present invention. In the domain epitaxy, many of the misfit dislocations may be confined near the interface between the domain-matched layers, which may limit the number of misfit dislocations threading into the active epitaxial layer.

Figure 2:
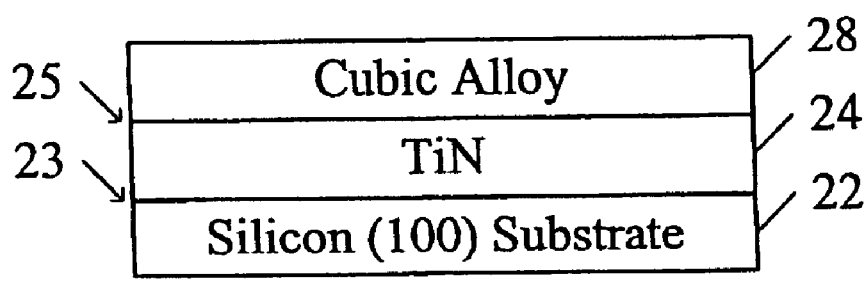
FIG. 2 is a cross-sectional view of embodiments of electronic devices according to the present invention having a titanium nitride buffer layer between a cubic alloy layer and a silicon substrate.

Referring now to FIG. 2, embodiments of electronic devices according to the present invention having a buffer layer will now be described. A titanium nitride buffer layer 24 is between a cubic alloy layer 28 and a silicon (100) substrate 22. The cubic alloy layer 28 and the silicon (100) substrate 22 are similar to the cubic alloy layer 18 and the silicon (100) substrate layer 12, respectively, as described above with reference to FIG. 1, and will not be further described. Although the buffer layer is shown as a titanium nitride buffer layer 24, it is to be understood that buffer layers according to the present invention may comprise various materials having a cubic structure including, but not limited to, titanium nitride, magnesium oxide, and tantalum nitride. Buffer layers according to the present invention may act as diffusion barriers.

Still referring to FIG. 2, the titanium nitride buffer layer 24 may be formed on the silicon (100) substrate 22 by various processes. The titanium nitride buffer layer 24 is preferably domain-matching epitaxially grown on the silicon (100) substrate 22 resulting in a buffer layer-substrate interface 23 where four lattice constants of the titanium nitride are domain-matched with three lattice constants of the silicon substrate. The cubic alloy layer 28 is preferably lattice-matching epitaxially grown on the titanium nitride buffer layer 24 resulting in an alloy layer-buffer layer interface 25 where the lattice constants of the alloy layer and the titanium nitride buffer layer are matched in an approximately 1:1 relationship (i.e., lattice-matched).

Figure 3:
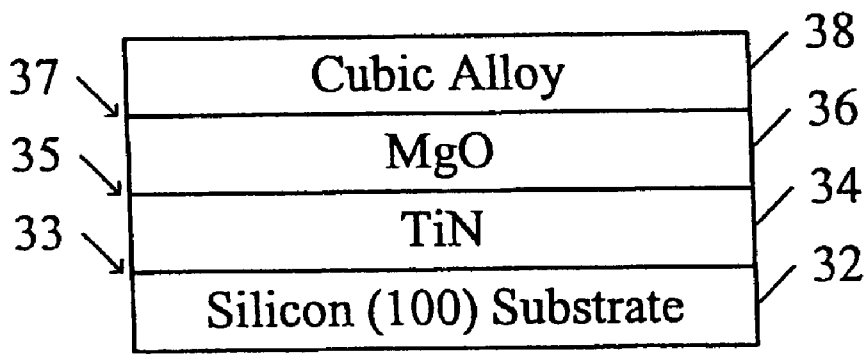
FIG. 3 is a cross-sectional view of embodiments of electronic devices according to the present invention having a cubic alloy layer on a magnesium oxide-titanium nitride-silicon epilayer heterostructure.

Referring to FIG. 3, embodiments of electronic devices according to the present invention having a cubic alloy layer on a magnesium oxide-titanium nitride-silicon (100) substrate epilayer heterostructure will now be described. A titanium nitride buffer layer 34 is formed directly on a silicon (100) substrate 32. A magnesium oxide layer 36 is between a cubic alloy layer 38 and the titanium nitride buffer layer 34. The cubic alloy layer 38, the titanium nitride buffer layer 34, and the silicon (100) substrate 32 are similar to the cubic alloy layer 28, the titanium nitride buffer layer 24, and the silicon (100) substrate 22, respectively, as described above with reference to FIG. 2, and will not be further described. The buffer layer-substrate interface 33 is similar to the buffer layer-substrate 23 described above with reference to FIG. 2, and will not be further described. The magnesium oxide layer 36 is preferably lattice-matching epitaxially grown on the titanium nitride buffer layer 34 resulting in a magnesium oxide layer-buffer layer interface 35 that is lattice-matched. The cubic alloy layer 38 is preferably lattice-matching epitaxially grown on the magnesium oxide layer 36 resulting in an alloy layer-magnesium layer interface 37 that is lattice-matched.

Figure 4:
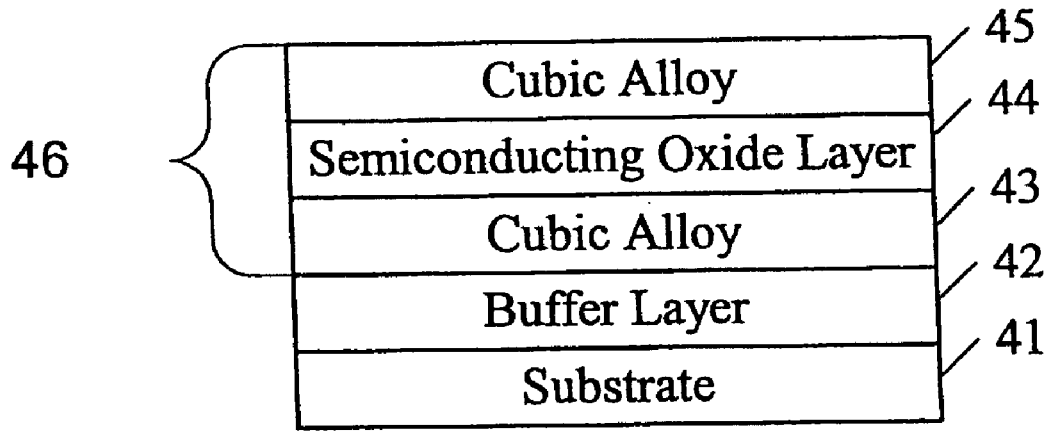
FIG. 4 is a cross-sectional view of electronic devices according to embodiments of the present invention having a quantum well structure.

Referring to FIG. 4, embodiments of electronic devices according to the present invention having a quantum well structure will now be described. In general, quantum well structures are known by those skilled in the art. See, e.g., McGRAw-HILL DICTIONARY OF SCIENTIFIC AND TECHNICAL TERMS 1621 (5th ed., 1994). According to embodiments of the present invention, a buffer layer 42 is on a substrate 41. The buffer layer 42 and the substrate 41 are similar to the buffer layer 24 and the substrate 22 described above with reference to FIG. 2 and will not be further described. A quantum well structure 46 is on the buffer layer 42. The quantum well structure 46 includes a cubic alloy layer 43 on the buffer layer 42, a semiconducting oxide layer 44 on the cubic layer 43 and a second cubic alloy layer 45 on the semiconducting oxide layer 44. The cubic alloy layer 43 and the second cubic alloy layer 45 have bandgaps that are wider than the bandgap of the semiconducting oxide layer 44. The cubic alloy layer 42 is similar to the cubic alloy layer 18 described above with reference to FIG. 1 and will not be further described.

The oxide layer 44 is preferably a cubic alloy layer according to the present invention having a magnesium content (at. %) that is less than the magnesium content of the cubic alloy layer 43. The oxide layer preferably has a thickness that is between about 10 and about 100 Å. As will be understood by those skilled in the art, the semiconducting oxide layer 44 may also consist of various other materials having a bandgap narrower than the bandgap of the cubic alloy layer 43 including, but not limited to, zinc oxide, cadmium oxide, cadmium zinc oxide, magnesium zinc oxide, and/or magnesium cadmium oxide, with cadmium zinc oxide being the most preferable.

While the second cubic alloy layer 45 is preferably a cubic alloy layer according to the present invention, as described above with reference to FIG. 1, having a bandgap wider than the bandgap of the semiconducting oxide layer 44, the second cubic alloy layer 45 can consist of various other materials as will be understood by those skilled in the art. The cubic alloy layer 43 and the second cubic alloy layer 45 may have the same composition or different compositions. Preferably, the cubic alloy layer 43 and the second cubic alloy layer 45 have the same composition. While the embodiments of FIG. 4 show an electronic device having a single quantum well, it is to be understood that electronic devices of the present invention may have multiple quantum wells. For example, a plurality of alternating alloy layers 43 and semiconducting oxide layers 44 may be provided. The use of cubic alloys according to the present invention in quantum wells may minimize the piezoelectric field across the quantum wells, which may provide an advantage over the use of wurtzite materials in the conventional III-nitride system where piezoelectric fields may adversely impact the luminescence of the device.

Figure 5:
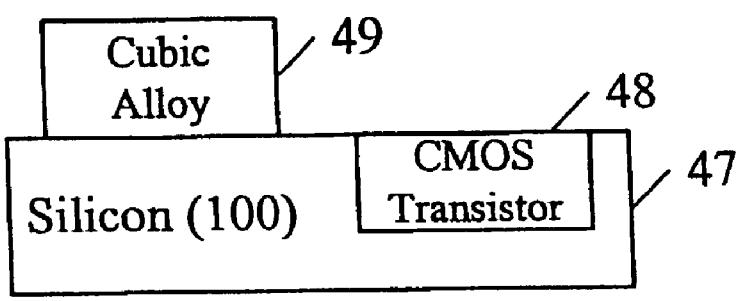
FIG. 5 is a cross-sectional view of electronic devices according to embodiments of the present invention.

Referring now to FIG. 5, embodiments of electronic devices according to the present invention having a microelectronic device in the silicon substrate will now be described. A cubic alloy layer 49 is directly on a silicon (100) substrate 47. The cubic alloy layer 49 and the silicon (100) substrate 47 are similar to the cubic alloy layer 18 and the silicon (100) substrate 12, respectively, as described above with reference to FIG. 1, and will not be further described. A CMOS transistor 48 is in the silicon (100) substrate 47. While the embodiments illustrated in FIG. 5 show a CMOS transistor 48 in the silicon (100) substrate 47, it is to be understood that electronic devices according to the present invention may have various microelectronic devices including, but not limited to, field effect transistors, bipolar transistors, diodes and/or power devices in the silicon (100) substrate. While the cubic alloy layer 49 is illustrated in FIG. 5 as a single layer, it is to be understood that the cubic alloy layer 49 may be any of the heterostructures having a cubic alloy layer illustrated in FIG. 1 through FIG. 4.

Optoelectronic devices according to embodiments of the present invention may be light-emitting diodes, laser diodes, UV detectors, and/or broad spectrum (e.g. white) light sources used, for example, in light bulbs. Microelectronic devices according to embodiments of the present invention may be transistors such as CMOS transistors, field effect transistors, and/or bipolar transistors, diodes, field emitters, and/or power devices as well as other integrated circuit devices. Embodiments of optoelectronic devices of the present invention may provide junctions in the cubic zinc alloy layer and/or between the cubic zinc alloy layer and the substrate and/or buffer layer to provide LEDs, laser diodes, UV detectors, broad band light sources, and/or other optoelectronic devices. Junctions may be provided by doping and/or other techniques as will be understood by those skilled in the art and will not be further described herein.

Figure 6:
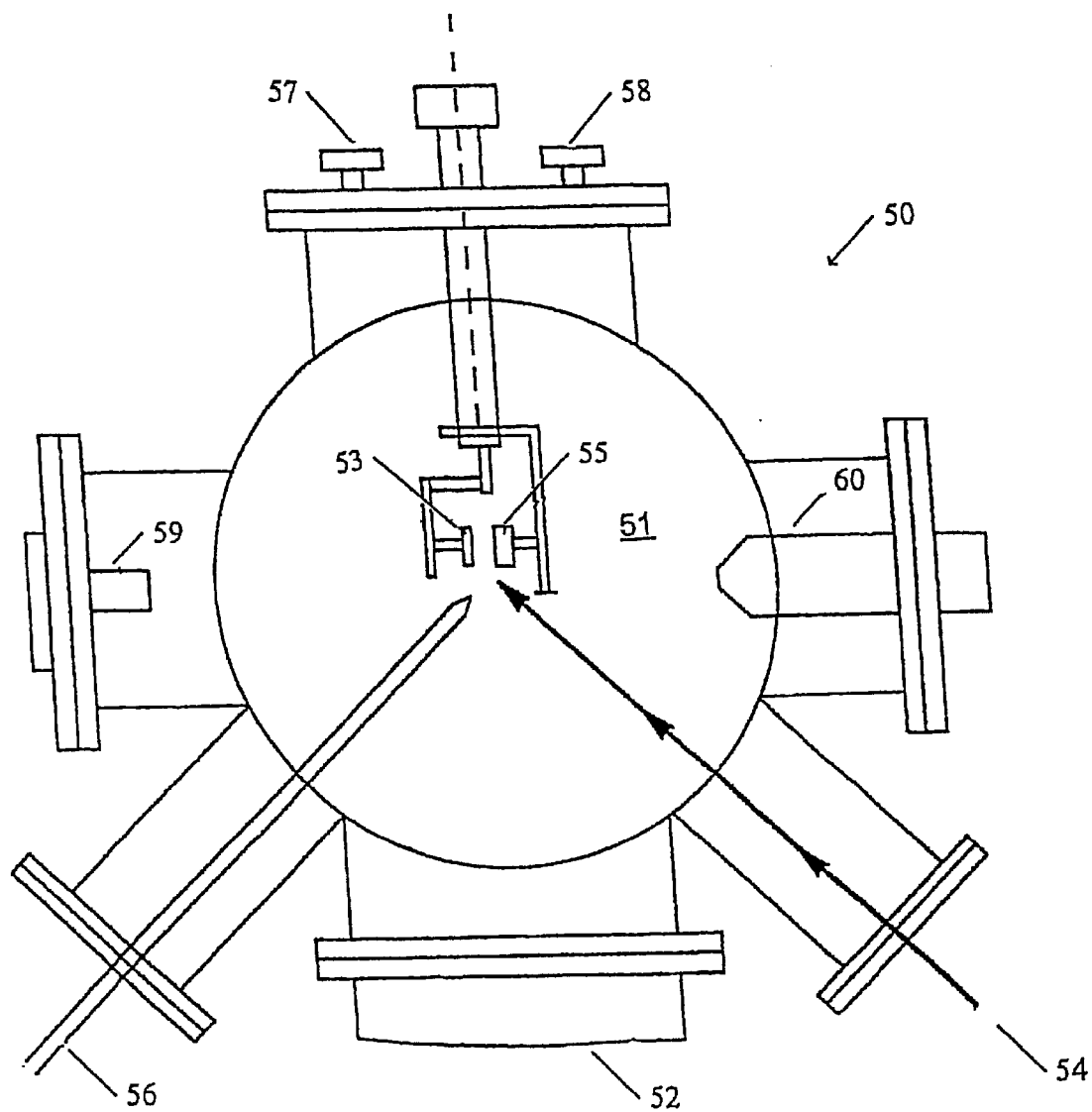
FIG. 6 is a schematic diagram illustrating a pulsed laser deposition system that can be used in performing methods according to embodiments of the present invention.

Referring now to FIG. 6, embodiments of an apparatus for pulsed laser depositing cubic zinc oxide alloy layers according to the present invention will now be described. While cubic zinc oxide alloy layers according to the present invention are preferably formed using pulsed laser deposition processes, it is to be understood that cubic zinc oxide alloy layers may be formed using various processes including, but not limited to, Molecular Beam Epitaxy (MBE), Hydride Vapor Phase Epitaxy (HVPE), magnetron sputtering techniques, and Chemical Vapor Deposition (CVD). These processes are well known to those having skill in the art and need not be described further herein.

Referring again to FIG. 6, the pulsed laser deposition apparatus 50 includes a multi-port chamber 51. A vacuum is maintained in the multi-port chamber 51 by means of a port 52 to a turbo molecular pump. The vacuum preferably is maintained between about $10^{-6}$ and $10^{-10}$ Torr, and more preferably between about $10^{-6}$ and $10^{-8}$ Torr. A target 53 is positioned parallel to a substrate 55 which is mounted on a heater plate. The target 53 preferably consists of ZnO—MgO or MgO—CdO. The magnesium oxide content is preferably between about 5 and 50 wt. %, and is more preferably between about 15 and 25 wt. %. The substrate may be a monocrystalline substrate such as those described above with reference to FIG. 1 and FIG. 5 or may be an epilayer heterostructure such as those described above with reference to FIG. 2 and FIG. 3. The distance between the target 53 and the substrate 55 is preferably between about 30 and 80 mm, and more preferably between about 40 and 60 mm. In some embodiments, freshly cleaved magnesium oxide (100) surfaces and c-plane sapphire are used as substrates for depositions. The depositions may also be carried out on silicon (100) substrate with a titanium nitride interlayer deposited in-situ using a rotating target holder with four slots.

Still referring to FIG. 6, a pulsed laser beam 54 is preferably generated by a pulsed KrF excimer laser. The pulsed KrF excimer laser has a wavelength preferably between about 193 and 248 nm, and more preferably about 248 nm; has a pulse width preferably between about 20 and 100 ns, and more preferably about 25 ns; and has a repetition rate preferably between about 1 and 15 Hz, more preferably between about 5 and 10 Hz, and most preferably 10 Hz. The laser beam 54 is incident on the target 53 at an angle that is preferably between about 40 and 55°, more preferably between about 40 and 50°, and most preferably about 45°. The laser beam 54 is focused on the target to achieve a fluence preferably between about 2 and 6 J/cm², and more preferably between about 2.5 and 3.5 J/cm².

In FIG. 6, the pulsed laser deposition is preferably performed in an oxygen partial pressure that is preferably between about $1\times10^{-5}$ and $5\times10^{-5}$ Torr, and most preferably at about $1.5\times10^{-5}$ Torr. The oxygen is preferably introduced into the multiport chamber 51 through gas inlet 56. During the deposition, the substrate 55 is preferably maintained at a temperature between about 600 and 800° C., and more preferably between about 700 and 750° C. The optimum growth temperature for ZnMgO alloys of the present invention on magnesium oxide and sapphire substrates is believed to be 750° C. at the oxygen partial pressure of $4\times10^{-5}$ Torr.

Prior to deposition, the target 53 is preferably sintered in an oxygen atmosphere at a temperature that is preferably between about 800 and 1300° C., more preferably between about 1000 and 1200° C., and most preferably about 1100° C. for between about 1 and 24 hours, more preferably between about 8 and 16 hours. The deposition system 50 also includes various auxiliary ports such as an electrical feedthrough 57, a thermocouple feedthrough 58, an ionization gauge 59, and a quadrupole mass spectrometer 60, which will be understood by those skilled in the art.

Films according to embodiments of the present invention were characterized using X-ray diffraction (XRD) and high resolution transmission electron microscopy (HRTEM) for microstructure, phase identification, and defect analysis, Rutherford Backscattering/ion channeling for composition and crystal quality, and optical transmission measurements for optical gap determinations.

Figure 7:
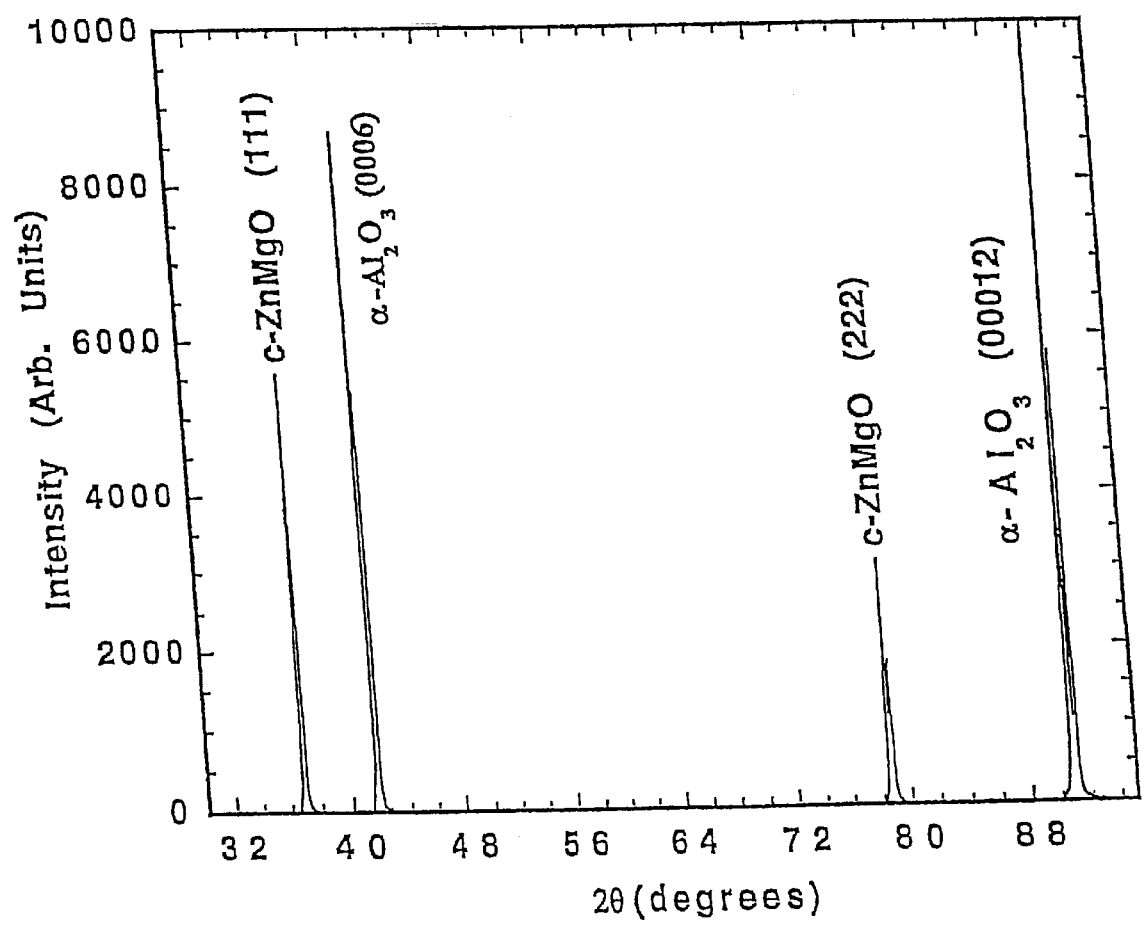
FIG. 7 shows an x-ray diffraction pattern of cubic $Zn_xMg_{1-x}O$ (111)/$\alpha$-$Al_2O_3$ (0001) hexagonal substrate heterostructure according to embodiments of the present invention.

Referring now to FIG. 7, an XRD pattern of a ZnMgO alloy layer on a hexagonal sapphire (0001) substrate will now be described. The X-ray diffraction (XRD) was carried out using a Cu Kα source with a wavelength of 1.541 Å. The zinc magnesium oxide alloy layer was domain-matching epitaxially grown on the sapphire substrate at a temperature of 750° C. This XRD pattern demonstrates the formation of a cubic phase of the zinc magnesium oxide alloy, which has a lattice constant that is close to that of magnesium oxide and titanium nitride, but is quite different from that of sapphire. The (111) and (222) reflections of the zinc magnesium oxide phase are clearly seen apart from the sapphire (0001) reflections. From the "2θ" values of (111)-reflection, the lattice constant of zinc magnesium oxide was calculated to be 4.234 Å. On a cubic TiN/Si (100) surface, the XRD showed (200)-reflection of titanium nitride with (200) peak of ZnMgO superimposed on it. Whereas on magnesium oxide (100) substrates, closely spaced peaks corresponding to ZnMgO and magnesium oxide (200) were observed. The lattice constant of MgO—ZnO alloy remains close to that of magnesium oxide, increasing slightly with the fraction of zinc oxide in the lattice, as predicted by the phase diagram. All the compositions of ZnMgO synthesized herein gave similar XRD peaks as shown in FIG. 6. The shift of peak positions as a function of the composition of alloy was relatively small.

Figure 8:
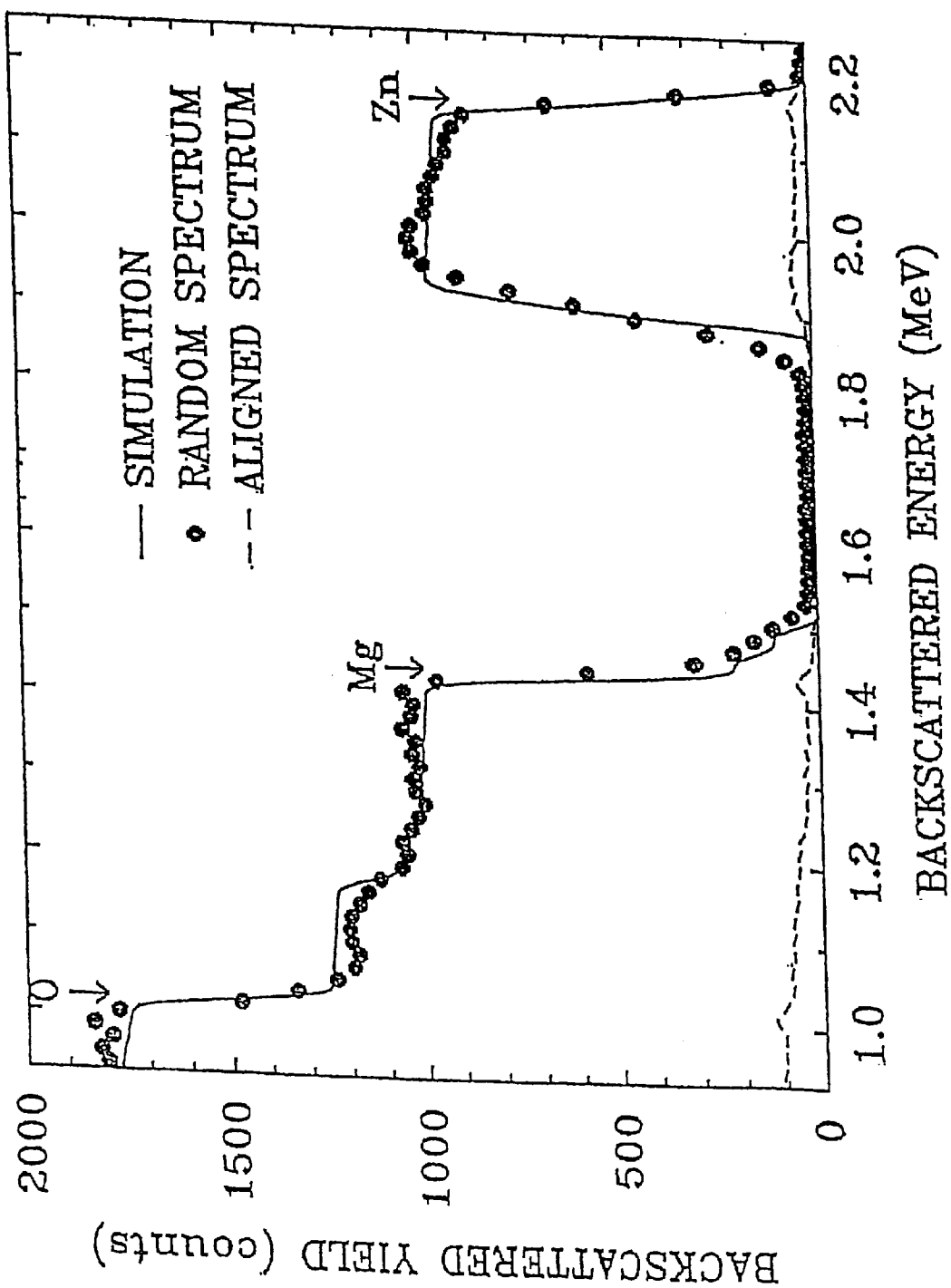
FIG. 8 shows a Rutherford Backscattering Spectrometry (RBS) spectrum of $Zn_{0.13}M_{0.87}O$ film on a cubic MgO (100) substrate according to embodiments of the present invention.

Referring now to FIG. 8, an RBS spectrum of the zinc magnesium oxide layer described above with reference to FIG. 7 will now be described. The RBS analyses were performed using a probe beam of 2.75 MeV He⁺ions and a standard, surface barrier detector position at 160°. Both random and aligned spectra were recorded to estimate the composition and the crystalline quality of the films. The atomic fraction of zinc and alloy was calculated by simulating the random yield using a range of compositions to find the best fit to the acquired data. The zinc content and the films grown on magnesium oxide (100) substrates (shown in FIG. 8), was estimated to be 13 at. %. The minimum channeling yield ($\chi_{min}$) from this sample is around 3% which is close to the value for bulk single crystal. The low value of $\chi_{min}$ indicates that the defect content is low as expected from single crystal material. The channeling yield does not increase appreciably near the interface in this sample which is consistent with cross-section TEM results. Thus, $Zn_xMg_{1-x}O$ alloy films are good candidates to modify the surface of MgO and tailor its optical properties as a function of Zn-content. The maximum Zn content obtained in these films was estimated to be 18 at. % from the RBS data.

Figure 9:
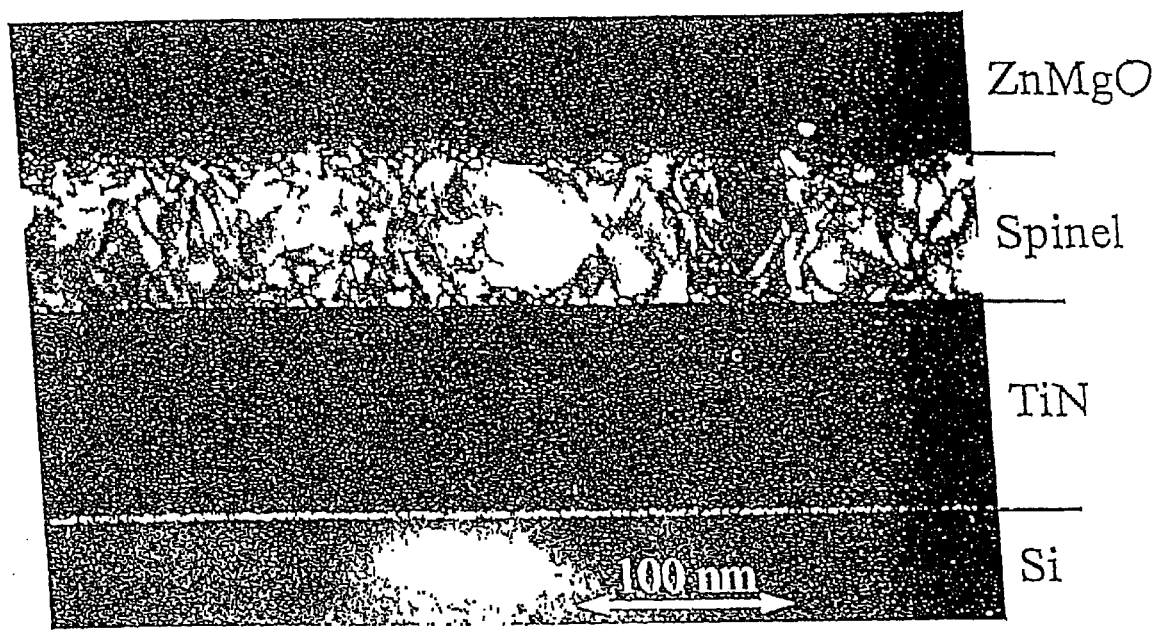
FIG. 9 shows a cross-section transmission electron microscope (TEM) micrograph of a ZnMgO alloy layer deposited on a TiN/Si (100) epilayer heterostructure according to embodiments of the present invention.

Referring now to FIG. 9, a (100) cross-section TEM micrograph from the ZnMgO sample deposited on a silicon (100) substrate with titanium nitride as an interlayer will now be described. The ZnMgO films were deposited on a TiN/Si heterostructure in this sample at 650° C. The (110) cross-section micrograph clearly shows four layers, ZnMgO/reacted layer/TiN/Si (substrate). From a fit to the RBS data of this sample, the composition of ZnMgO was determined to be $Zn_{0.18}Mg_{0.82}O$.

Referring now to FIG. 10, various (110) selected-area micro-diffraction patterns from different layers will now be described. FIG. 10A shows a zinc magnesium oxide/spinel layer. The diffraction spots corresponding to the zinc magnesium oxide layer are labeled as b and the diffraction spots corresponding to spinel are labeled as c. In FIG. 10B, the diffraction spots corresponding to titanium nitride are labeled as b, and the diffraction spots corresponding to silicon are labeled as a. FIG. 10C shows diffraction spots from all the layers which are clearly aligned as expected from epitaxial growth. These diffraction studies show epitaxial ZnMgO films possessing cubic symmetry with cube-on-cube alignment. The lattice constant of ZnMgO (4.23 Å) was found to be very close to that of titanium nitride (4.24 Å), in agreement with the XRD results. The alignment of diffraction spots from titanium nitride, spinel and ZnMgO phase also demonstrates the cube-on-cube epitaxial nature of the films on silicon (100) substrates, where four lattice constants of titanium nitride match with three of the substrate via domain epitaxy. From diffraction results, the lattice constant of spinel was estimated to be 8.44 Å corresponding to $Mg_{2-x}Zn_xTiO_4(a_o\sim 8.44$ Å$)$.

Figure 11:
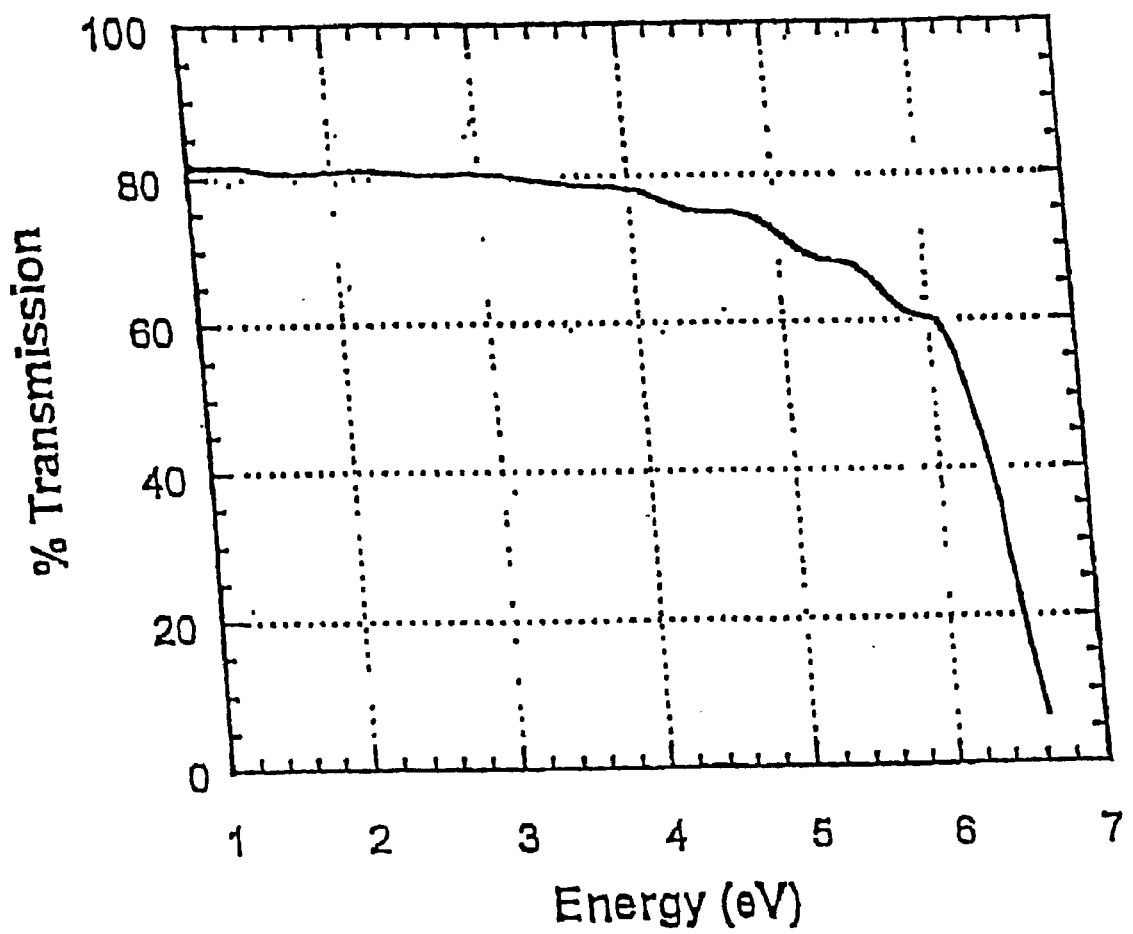
FIG. 11 shows the transmission spectrum of the cubic ZnMgO film deposited on c-plane sapphire according to embodiments of the present invention.

Referring now to FIG. 11, a transmission spectrum of cubic $Zn_{0.18}Mg_{0.82}O$ film on sapphire will now be described. A Cary 5E-UV-VIS-NIR spectrophotometer was used to obtain optical transmission measurements on these films. From these measurements, the bandgap of cubic ZnMgO was estimated to be close to 6.7 eV which is higher than that obtained in previous measurements of wurtzite $Mg_{0.34}Zn_{0.64}O$ films grown on sapphire where the bandgap was determined to be 4.19 eV. Without being bound to a particular theory, the improved bandgap may be due to the fact that the magnesium content in these films is higher than that in the wurtzite phase, and also due to the change of symmetry from hexagonal to cubic at high magnesium contents.

Embodiments of the present invention may provide chemically stable cubic $Zn_xMg_{1-x}O$ films on MgO, c-plane sapphire and silicon (100) substrates by pulsed laser ablation. The TEM and XRD studies of these films reveal the cubic symmetry in this phase with x varying between 0.0 and 0.18. The lattice constants of these films may be close to that of magnesium oxide and nearly identical to that of titanium nitride. The titanium nitride, therefore, may provide an excellent buffer layer for integrating these films with silicon. The bandgap of cubic $Zn_{0.18}Mg_{0.82}O$ films was determined to be approximately 6.7 eV, which may be higher than that obtained from the hexagonal $Mg_{0.34}Zn_{0.66}O$ films. The design of electronic materials such as the cubic phase of ZnMgO alloys and MgCdO alloys according to embodiments of the present invention may permit the tailoring of bandgaps, which may allow control of the optoelectronic properties in the visible and the UV range and provide for integration with silicon microelectronic devices.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:
1. An electronic device comprising:
a substrate; and
an alloy layer comprising MgO and at least one of ZnO and CdO on the substrate, wherein the alloy has a cubic structure.
2. The device according to claim 1, wherein the alloy layer consists essentially of between about 0.1 and 40 at. % zinc, and between about 60 and 99.9 at. % magnesium.
3. The device according to claim 1, wherein the alloy layer consists essentially of between about 0.1 and 15 at. % cadmium, and between about 85 and 99.9 at. % magnesium.
4. The device according to claim 1, wherein the alloy layer is a monocrystalline alloy layer.
5. The device according to claim 1, wherein the substrate consists of material having a cubic structure.
6. The device according to claim 1, wherein the substrate consists of a material having a cubic structure selected from the group consisting of MgO, Si, and GaAs.
7. The device according to claim 1, wherein the substrate consists of material having a hexagonal wurtzite structure.
8. The device according to claim 1, wherein the substrate consists of a material having a hexagonal structure selected from the group consisting of $\alpha$-$Al_2O_3$, 6H-SiC, AlN, and GaN (0001).
9. The device according to claim 1, wherein the alloy layer is a domain-matched epitaxial layer that is directly on the substrate.
10. The device according to claim 1, further comprising a buffer layer between the substrate and the alloy layer.
11. The device according to claim 10, wherein the buffer layer is a domain-matched epitaxial layer directly on the substrate, and wherein the alloy layer is a lattice-matched epitaxial layer directly on the buffer layer.
12. The device according to claim 10, wherein the alloy layer is a first alloy layer having a first bandgap, and wherein the device further comprises:
a second alloy layer having a second bandgap narrower than the first bandgap on the first alloy layer; and
a third alloy layer having a third bandgap wider than the second bandgap on the second alloy layer to thereby provide a quantum well.
13. The device according to claim 12, wherein the third alloy layer is an alloy layer comprising magnesium oxide and at least one of zinc oxide and cadmium oxide and having a cubic structure.
14. The device according to claim 12, wherein the device comprises a plurality of alternating layers of the first alloy and the second alloy on the substrate to thereby provide a multiple quantum well.
15. The device according to claim 1, further comprising a TiN layer between the substrate and the alloy layer.
16. The device according to claim 15, wherein the substrate is Si, and wherein the TiN layer and the Si substrate form a TiN/Si epilayer heterostructure.
17. The device according to claim 16, further comprising a MgO layer between the TiN layer and the alloy layer.
18. The device according to claim 17, wherein the substrate is Si, and wherein the MgO layer, the TiN layer, and the Si substrate form a MgO/TiN/Si epilayer heterostructure.
19. The device according to claim 1, wherein the electronic device is an optoelectronic device.
20. The device according to claim 19, wherein the optoelectronic device comprises at least one of light-emitting diodes, laser diodes, photodetectors, optical modulators, and broad band light sources.
21. The device according to claim 1, wherein the electronic device is a microelectronic device.

22. The device according to claim 21, wherein the microelectronic device comprises at least one of transistors, field emitters and power devices.

23. An electronic device comprising:

a monocrystalline silicon substrate; and an alloy layer comprising MgO and at least one of ZnO and CdO on the monocrystalline silicon substrate, wherein the alloy has a cubic structure.

24. The device according to claim 23, further comprising a microelectronic device in the monocrystalline silicon substrate.

25. The device according to claim 23, wherein the alloy layer consists essentially of between about 0.1 and 40 at. % zinc, and between about 60 and 99.9 at. % magnesium.

26. The device according to claim 23, wherein the alloy layer consists essentially of between about 0.1 and 15 at. % cadmium, and between about 85 and 99.9 at. % magnesium.

27. The device according to claim 23, wherein the alloy layer is a monocrystalline alloy layer.

28. The device according to claim 23, wherein the monocrystalline silicon substrate comprises a substrate and a monocrystalline silicon layer on the substrate.

29. The device according to claim 23, wherein the alloy layer is a domain-matched epitaxial layer that is directly on the substrate.

30. The device according to claim 23, further comprising a buffer layer between the substrate and the alloy layer.

31. The device according to claim 30, wherein the buffer layer is a domain-matched epitaxial layer directly on the substrate, and wherein the alloy layer is a lattice-matched epitaxial layer directly on the buffer layer.

32. The device according to claim 30, wherein the alloy layer is a first alloy layer having a first bandgap, and wherein the device further comprises:

a second alloy layer having a second bandgap narrower than the first bandgap on the first alloy layer; and a third alloy layer having a third bandgap wider than the second bandgap on the second alloy layer to thereby provide a quantum well.

33. The device according to claim 32, wherein the third alloy layer is an alloy layer comprising magnesium oxide and at least one of zinc oxide and cadmium oxide and having a cubic structure.

34. The device according to claim 32, wherein the device comprises a plurality of alternating layers of the first alloy and the second alloy on the substrate to thereby provide a multiple quantum well.

35. The device according to claim 23, further comprising a TiN layer between the substrate and the alloy layer.

36. The device according to claim 35, wherein the substrate is Si, and wherein the TiN layer and the Si substrate form a TiN/Si epilayer heterostructure.

37. The device according to claim 36, further comprising a MgO layer between the TiN layer and the alloy layer.

38. The device according to claim 37, wherein the substrate is Si, and wherein the MgO layer, the TiN layer, and the Si substrate form a MgO/TiN/Si epilayer heterostructure.

39. The device according to claim 23, wherein the electronic device is an optoelectronic device.

40. The device according to claim 39, wherein the optoelectronic device comprises at least one of light-emitting diodes, laser diodes, photodetectors, optical modulators, and broad band light sources.

41. The device according to claim 23, wherein the electronic device is a microelectronic device.

42. The device according to claim 41, wherein the microelectronic device comprises at least one of transistors, field emitters and power devices.

* * * * *